(12) United States Patent
Ferguson et al.

(10) Patent No.: US 12,050,243 B2
(45) Date of Patent: Jul. 30, 2024

(54) SAFETY CONTAINER FOR HIGH POWER DEVICE TESTING OVER A RANGE OF TEMPERATURES

(71) Applicant: Keithley Instruments, LLC, Solon, OH (US)

(72) Inventors: Aaron Ferguson, Twinsburg, OH (US); James D. Bucci, Cleveland Heights, OH (US); Gregory Sobolewski, Brecksville, OH (US); Brian D. Smith, Whitsett, NC (US); Jeffrey J. Trgovich, Macedonia, OH (US)

(73) Assignee: Keithley Instruments, LLC, Solon, OH (US)

( * ) Notice: Subject to any disclaimer, the term of this patent is extended or adjusted under 35 U.S.C. 154(b) by 70 days.

(21) Appl. No.: 17/750,261

(22) Filed: May 20, 2022

(65) Prior Publication Data

US 2022/0381813 A1   Dec. 1, 2022

Related U.S. Application Data

(60) Provisional application No. 63/193,391, filed on May 26, 2021.

(51) Int. Cl.
  *G01R 31/26* (2020.01)
  *G01R 1/04* (2006.01)

(52) U.S. Cl.
  CPC .......... *G01R 31/2601* (2013.01); *G01R 1/04* (2013.01)

(58) Field of Classification Search
  CPC .......... G01R 1/04; G01R 31/26; G01R 31/00; G01R 31/003; G01R 31/2601; G01R 31/2642; G01R 31/2862; G01R 31/2874; G01R 31/261; G01R 31/2623; G01R 31/2875
  USPC ...................................... 324/750.25
  See application file for complete search history.

(56) References Cited

U.S. PATENT DOCUMENTS

2004/0046584 A1 * 3/2004 Ollila ............... G01R 31/2862
                                                  324/750.08

FOREIGN PATENT DOCUMENTS

| CN | 110018374 A | * | 7/2019 | ............ G01M 13/00 |
| EP | 2881723 A2 | * | 6/2015 | ............ G01M 99/00 |
| JP | 2004347329 A | * | 12/2004 | ............ G01R 31/26 |

OTHER PUBLICATIONS

English translation of JP2004347329A (Year: 2004).*
English translation of EP2881723 A2 (Year: 2015).*
English translation of CN 110018374 A (Year: 2019).*

* cited by examiner

*Primary Examiner* — Eman A Alkafawi
*Assistant Examiner* — Courtney G McDonnough
(74) *Attorney, Agent, or Firm* — Miller Nash LLP; Andrew J. Harrington; Krista Y. Chan

(57) ABSTRACT

A safety container for high-power, electronic device testing, the safety container including a first shell and first and second ports in the first shell. The first shell is configured to substantially surround a testing chamber sized to accommodate a device-under-test (DUT). The first shell is substantially rigid. The first port is configured to allow a fluid into the testing chamber, the second port configured to allow the fluid to exit the testing chamber.

18 Claims, 5 Drawing Sheets

SAFETY CONTAINER FOR HIGH POWER DEVICE TESTING OVER A RANGE OF TEMPERATURES

CROSS-REFERENCES TO RELATED APPLICATIONS

This patent application claims the benefit of provisional Application No. 63/193,391 filed May 26, 2021, the disclosure of which is incorporated herein by reference in its entirety.

TECHNICAL FIELD

This disclosure relates to test and measurement systems, and more particularly to test and measurement systems for high-power testing of a device under test (DUT).

BACKGROUND

Semiconductor devices, for example wide band gap SiC or GaN devices, and other electronic devices often require high-power testing and/or device characterization. Some devices require characterization across a wide temperature range.

Some conventional test systems provide partial solutions for device testing. For example, the Keysight N1265A provides the ability to perform high-power testing on such devices, but does not include temperature testing abilities, nor does it provide complete debris containment in the event of an explosion of the DUT. Likewise, available conventional temperature testing options do not include high power destructive test containment.

Configurations of the disclosed technology address shortcomings in the prior art.

DETAILED DESCRIPTION

As described herein, configurations provide a comprehensive solution for high-power device testing and characterization over a range of temperatures, and with full containment of debris and fumes in the event of a DUT explosion. Embodiments allow users to perform, for example, breakdown tests of DUTs at a range of temperatures. As used in this context, "high-power device" means either of (a) a device operating above 1000 watts instantaneous or (b) a device that, if it were to catastrophically fail during operation, could pose a risk of injury risk to the operator.

Figure 1:
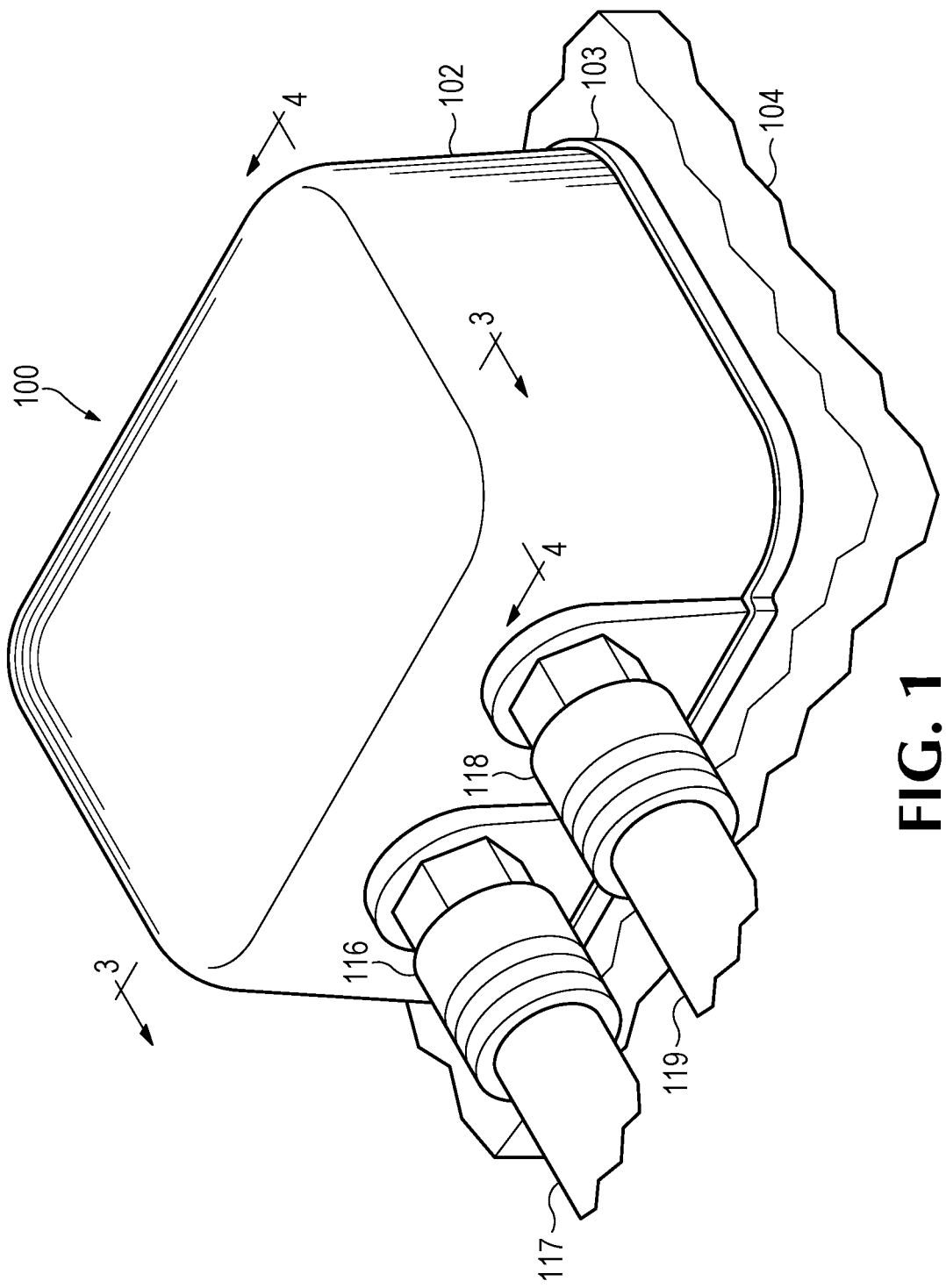
FIG. 1 is an isometric view of a safety container, according to an example configuration, installed on an example support surface and connected to example fluid lines.
Figure 2:
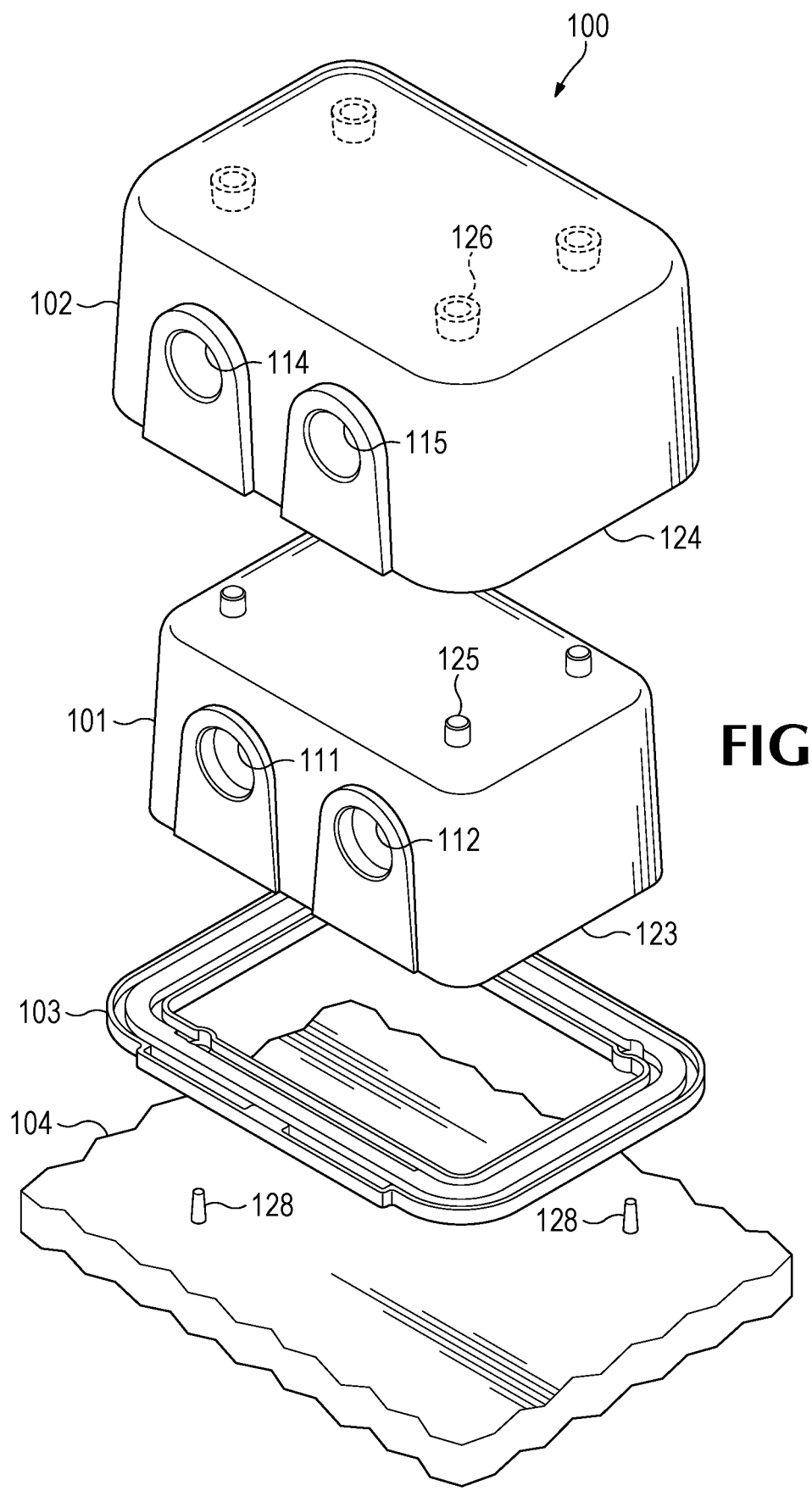
FIG. 2 is an exploded view of the safety container of FIG. 1.
Figure 3:
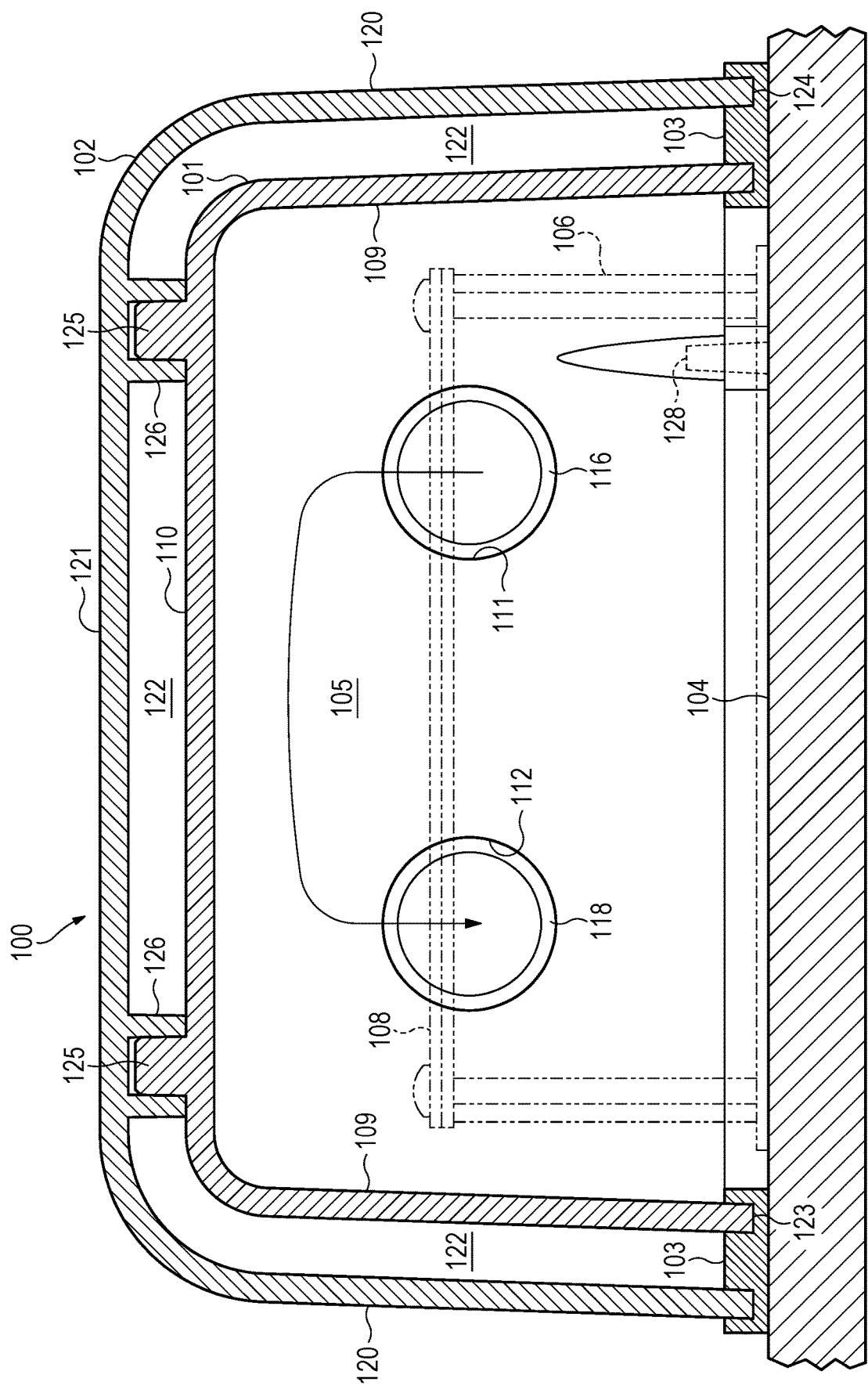
FIG. 3 is a sectional view as defined in FIG. 1.
Figure 4:
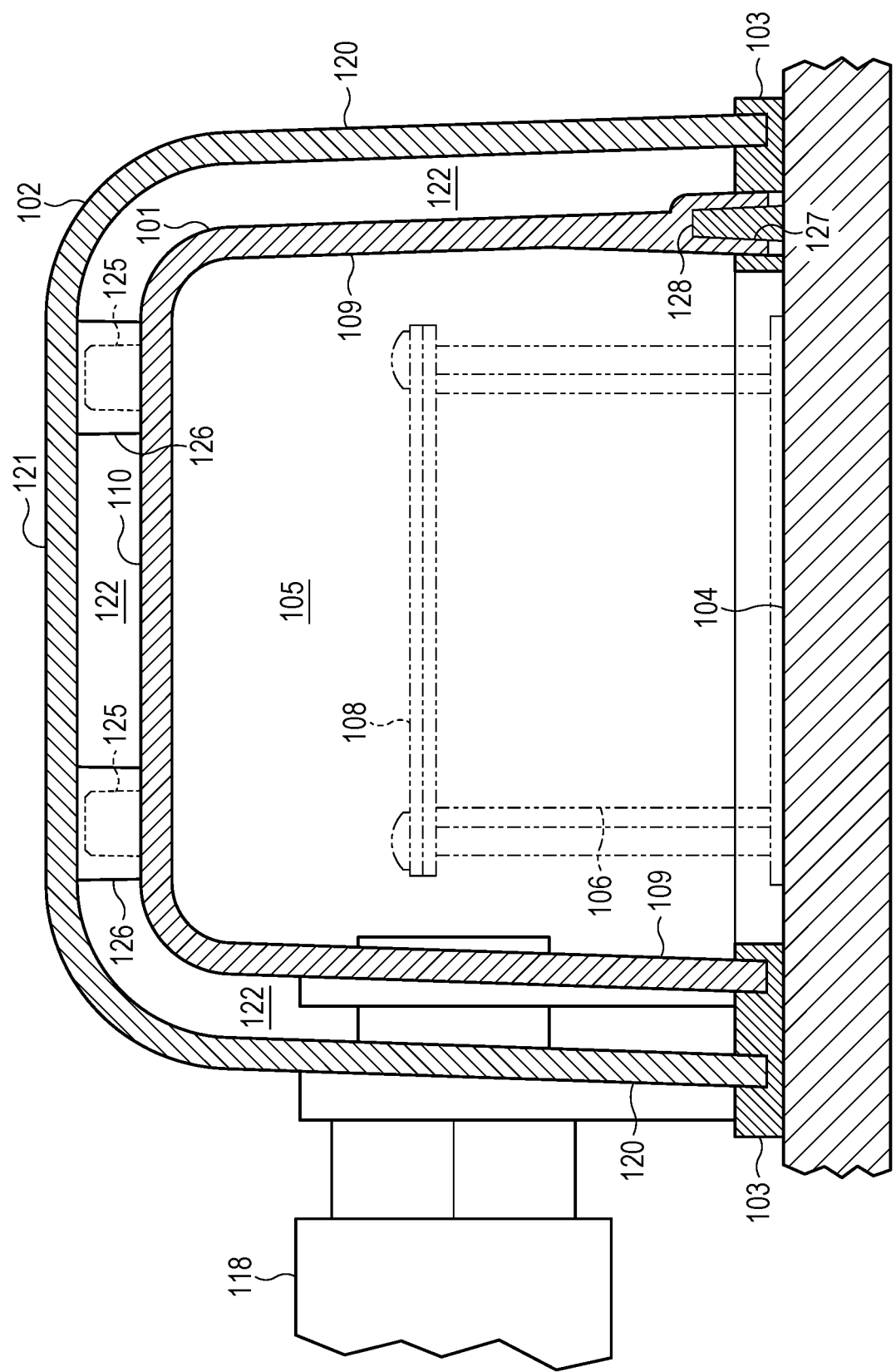
FIG. 4 is a sectional view as defined in FIG. 1.
Figure 5:
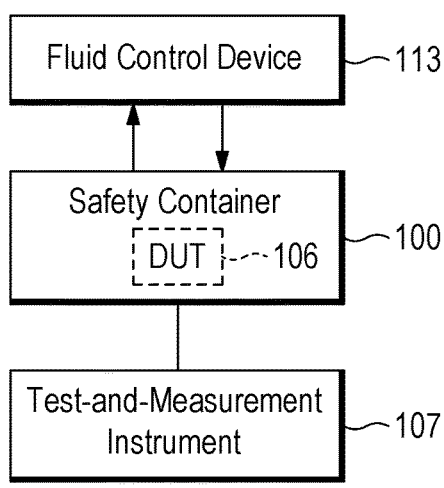
FIG. 5 is a functional schematic showing the relationship between example components.

FIG. 1 is an isometric view showing portions of a safety container, according to an example configuration. FIG. 2 is an exploded view of the safety container of FIG. 1. FIGS. 3 and 4 are sectional views as defined in FIG. 1. FIG. 5 is a functional schematic showing the relationship between example components.

As illustrated in FIGS. 1-4, a safety container 100 may include a first shell 101, a second shell 102, and a gasket 103. The safety container 100 may be installed on a support surface 104. The support surface 104 may be, for example, a workbench, a test fixture, a portion of a printed circuit board (PCB), or other platform for testing electronic circuits.

The first shell 101 is configured to substantially surround a testing chamber 105 sized to accommodate a device-under-test (DUT) 106. As used in this context, "substantially surround" means largely or essentially extending around, without requiring perfect encircling. For example, it is understood that the safety container 100 may rest on a support surface 104 as noted. Hence, the first shell 101 need not extend underneath the testing chamber 105 in all configurations as the combination of the first shell 101 and the support surface 104 would together surround the testing chamber 105.

The DUT 106 may be, for example, an electronic circuit. In configurations, the DUT 106 may be a circuit element having a 62-millimeter form factor, such as a SiC or GaN power module, for example. In such configurations, the testing chamber 105 is sized to accommodate circuit elements having a 62-millimeter form factor. Other sizes could be accommodated in other configurations. As illustrated in FIG. 5, the DUT 106 may be connected to a test-and-measurement instrument 107, such as an oscilloscope. In configurations, the DUT 106 may be secured within the testing chamber 105 by a testing fixture 108.

In configurations, the first shell 101 is substantially rigid. As used in this context, "substantially rigid" means largely or essentially stiff and not pliant, without requiring perfect inflexibility. In such configurations, the rigidity of the first shell 101 may help to improve the ability of the safety container 100 to insulate the area outside of the safety container 100 from explosion, in the event the DUT 106 were to burst under test.

As illustrated in FIGS. 1-4, the first shell 101 may include one or more side walls 109 and a top surface 110. In configurations, the one or more side walls 109 and the top surface 110 are formed from a single piece. In other words, there are no welds or other joints to connect two or more pieces to form the side walls 109 and top surface 110. In such configurations, the single-piece construction improves the ability of the first shell 101, and the safety container 100 as a whole, to insulate the area outside of the safety container 100 if the DUT 106 were to explode.

In configurations, the first shell 101 is made from or otherwise includes an electrically non-conductive material. In such configurations, the first shell 101 helps to electrically insulate the testing chamber 105, and the DUT 106 within the testing chamber 105, from the region outside of the safety container 100, such as where the operator might be.

In configurations, the first shell 101 is a rectangular dome. As used in this context, "rectangular dome" means a dome structure having substantially rectangular horizontal cross sections through the side walls 109. As used in this disclosure, "substantially rectangular" means largely or essentially shaped like a rectangle or a square, while still allowing, for example, rounded corners. Such cross sections are horizontal, or parallel to the support surface 104, from the perspective shown in FIGS. 1-4. The first shell 101 is depicted as being a rectangular dome in each of FIGS. 1-4. In configurations, the first shell 101 is a circular dome or a right cylinder, having a circular cross section.

In configurations, the first shell 101 includes a first port 111 and a second port 112. The first port 111 is configured to allow a fluid into the testing chamber 105, and the second port 112 is configured to allow the fluid to exit the testing chamber 105. It is understood that what is labeled in the drawings as the first port 111 could instead be where the fluid exits the testing chamber 105, and the second port 112 could be where the fluid enters the testing chamber 105.

In configurations, the fluid entering the testing chamber is at a predetermined temperature to provide a desired testing temperature within the testing chamber 105. In configurations, the fluid is air. Hence, for example, the fluid may be introduced into the first port 111 by a fluid control device 113 (see FIG. 5). In configurations, the fluid control device 113 introduces the fluid into the first port 111 at a predetermined temperature, the temperature being controlled by the fluid control device 113. The fluid control device 113 may be used instead of, or in addition to, other temperature control features discussed in this disclosure. In configurations, the fluid exiting the testing chamber 105 returns to the fluid control device 113. In other configurations, the fluid exiting the testing chamber 105 is vented or otherwise expelled somewhere other than the fluid control device 113, such as to the atmosphere, a drain, or to a pollution control device in circumstances where the fluid may contain pollutants.

The second shell 102 is configured to couple to the support surface 104 and to substantially surround the first shell 101. As noted above, "substantially surround" means largely or essentially extending around, without requiring perfect encircling. Accordingly, where the safety container 100 is resting on a support surface 104, the second shell 102 need not extend underneath the first shell 101 or the testing chamber 105 in all configurations as the combination of the second shell 102 and the support surface 104 would together surround the first shell 101.

In configurations, the second shell 102 includes a first port 114 and a second port 115. The first port 114 of the second shell 102 is aligned with the first port 111 of the first shell 101 to allow the fluid into the testing chamber 105. Similarly, the second port 115 of the second shell 102 is aligned with the second port 112 of the first shell 101 to allow the fluid to exit the testing chamber 105. As noted above for the first shell 101, it is understood that what is labeled in the drawings as the first port 114 could instead be where the fluid exits the testing chamber 105, and what is labeled in the drawings as the second port 115 could be where the fluid enters the testing chamber 105.

As illustrated in FIG. 1, the first ports 111, 114 may be configured to accept a first fluid fitting 116 attached to a first fluid line 117. The first fluid line 117 may be connected to the fluid control device 113 or other source of fluid. As illustrated in FIG. 1, the second ports 112, 115 may be configured to accept a second fluid fitting 118 attached to a second fluid line 119. The second fluid line 119 may be connected to the fluid control device 113 or other drain or vent for the fluid that exits the testing chamber 105.

As illustrated in FIGS. 1-4, the second shell 102 may include one or more side walls 120 and a top surface 121. In configurations, the one or more side walls 120 and the top surface 121 are formed from a single piece. On other words, there are no welds or other joints to connect two or more pieces to form the side walls 120 and top surface 121. In such configurations, the single-piece construction improves the ability of the second shell 102, and the safety container 100 as a whole, to insulate the area outside of the safety container 100 if the DUT 106 were to explode.

In configurations, the second shell 102 is made from or otherwise includes an electrically non-conductive material. In such configurations, the second shell 102 helps to electrically insulate the testing chamber 105, and the DUT 106 within the testing chamber 105, from the region outside of the safety container 100. In other configurations, the second shell 102 is made from a metal, such as aluminum.

In configurations, the second shell 102 is a rectangular dome. The second shell 102 is depicted as being an example of a rectangular dome in each of FIGS. 1-4. In configurations, the second shell 102 is a circular dome or a right cylinder, having a circular cross section.

In configurations, there may be an air gap 122 between the first shell 101 and the second shell 102. The air gap 122 may help ensure that the first shell 101 and the second shell 102 are not in direct contact (except, in configurations, at the protrusions 125 and receptacles 126 discussed below). In configurations, air within the air gap 122 may be circulated or may be temperature controlled, or both, to help provide a desired testing temperature within the testing chamber 105. The air gap 122 may be used instead of, or in addition to, other temperature control features discussed in this disclosure.

In configurations, one or both of the first port 111 of the first shell 101 or the second port 112 of the first shell 101 may be configured to accept a camera, such as a thermal camera. In such configurations, the corresponding first port 114 of the second shell 102 or second port 115 of the second shell 102 would also be configured in the same way, in each case instead of, or in addition to, allowing fluid to pass into or exit from the testing chamber 105.

In configurations, a gasket 103 is configured to seal between one or both of a rim 123 of the first shell 101 or a rim 124 of the second shell 102 and the support surface 104. The gasket 103 may, for example, improve the ability of the safety container 100 to insulate the area outside of the safety container 100 from explosion of the DUT 106. The gasket 103 may, for example, improve the ability of the safety container 100 to maintain a desired testing temperature within the testing chamber 105.

In configurations, either of the first shell 101 or the second shell 102 has a protrusion 125 that engages with a receptacle 126 on the other of the first shell 101 or the second shell 102 to align the first shell 101 to the second shell 102. In the example configuration illustrated in FIG. 3, the first shell 101 has protrusions 125 and the second shell 102 has receptacles 126.

In configurations, the support surface 104 includes a heating element, such as a hot plate, to provide a desired testing temperature within the testing chamber 105. The heating element may be used instead of, or in addition to, other temperature control features discussed in this disclosure.

In configurations, the safety container 100 is configured to couple to the support surface 104 through offset pin holes 127 in the safety container 100 and mating pins 128 on the support surface 104. Hence, for example, the first shell 101 or the second shell 102, or both, may include offset pin holes 127. In the example configuration illustrated in FIGS. 2-4, the first shell 101 includes offset pin holes 127. It is understood that, in configurations, the offset pin holes 127 may instead be in the support surface 104, while the safety container 100 may instead include the mating pins 128. The pin holes are offset so that they allow proper installation of the safety container 100 onto the support surface 104 in one orientation only.

In configurations, the safety container 100 may include a thermal interlock or a voltage interlock, or both, to prevent removal of the safety container 100 from the support surface 104 (or removal of the DUT 106 from the testing chamber 105 within the safety container 100) until the voltage or the temperature, or both, are below predetermined thresholds.

Figure 6:
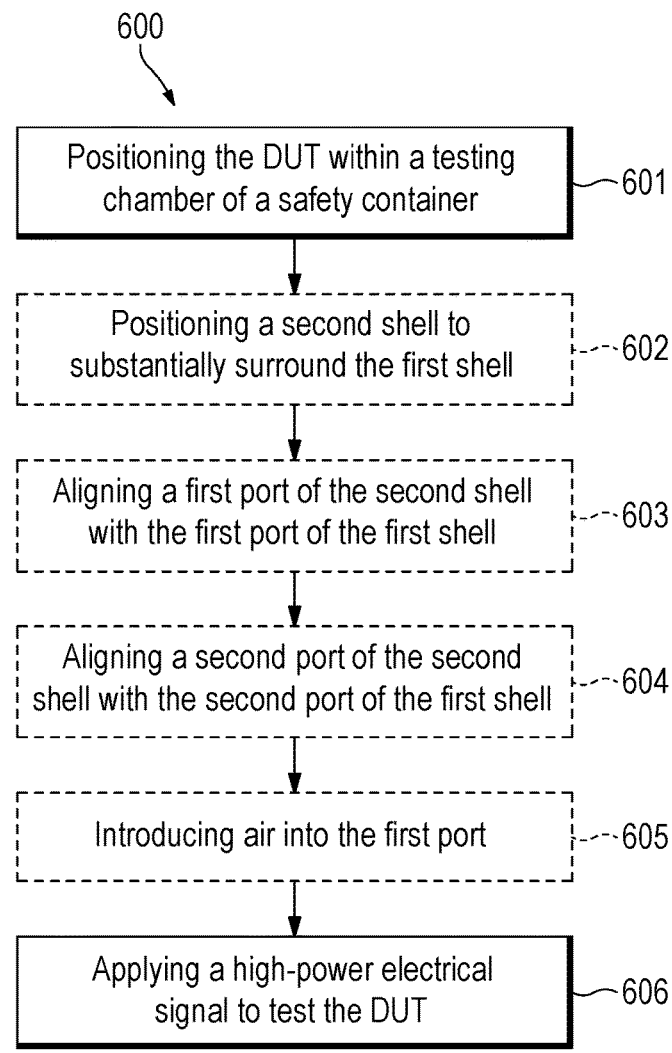
FIG. 6 illustrates an example method of testing an electronic device-under-test.

FIG. 6 shows an example method of testing an electronic device-under-test. As illustrated in FIG. 6, a method 600 of testing a DUT 106 may include positioning 601 the DUT 106 within a testing chamber 105 of a safety container 100, the testing chamber 105 being substantially surrounded by a substantially rigid first shell 101 that is sized to accommodate the DUT 106, the first shell 101 having a first port 111 and a second port 112, the first port 111 configured to allow a fluid into the testing chamber 105, the second port 112 configured to allow the fluid to exit the testing chamber 105; and applying 606 a high-power electrical signal to test the DUT 106.

In configurations, positioning 601 the DUT 106 within the testing chamber 105 may include coupling the first shell 101 to a support surface 104 through offset pin holes 127 in the first shell 101 and mating pins 128 on the support surface 104.

In configurations, the method 600 may include introducing 605 air into the first port 111, which, in configurations may be at a predetermined temperature.

In configurations, the method 600 may include, before applying 606 the high-power electrical signal to test the DUT 106: positioning 602 a second shell 102 to substantially surround the first shell 101; aligning 603 a first port 114 of the second shell 102 with the first port 111 of the first shell 101; and aligning 604 a second port 115 of the second shell 102 with the second port 112 of the first shell 101.

In configurations, positioning 602 the second shell 102 to substantially surround the first shell 101 may include engaging a protrusion 125 on either of the first shell 101 or the second shell 102 with a receptacle 126 on the other of the first shell 101 or the second shell 102 to align the first shell 101 to the second shell 102.

In configurations, the first shell 101 and the second shell 102 are simultaneously coupled to the support surface 104. Hence, for example, the first shell 101 may be coupled to the second shell 102 before the first shell 101 and the second shell 102 are coupled to the support surface 104.

Accordingly, configurations provide a high-power electronic device testing and characterization over a range of temperatures, with full containment of debris and fumes in the event of a DUT explosion. In addition, having two shells may, in configurations, provide better thermal, electrical, and explosive insulation than having a single shell around a testing chamber.

EXAMPLES

Illustrative examples of the disclosed technologies are provided below. A particular configuration of the technologies may include one or more, and any combination of, the examples described below.

Example 1 includes a safety container for high-power, electronic device testing, the safety container comprising: a first shell configured to substantially surround a testing chamber sized to accommodate a device-under-test (DUT), the first shell being substantially rigid; and first and second ports in the first shell, the first port configured to allow a fluid into the testing chamber, the second port configured to allow the fluid to exit the testing chamber.

Example 2 includes the safety container of Example 1, in which the fluid is air at a predetermined temperature.

Example 3 includes the safety container of any of Examples 1-2, in which the first shell is configured to couple to a support surface, the safety container further comprising a gasket around a rim of the first shell, the gasket configured to seal between the first shell and the support surface.

Example 4 includes the safety container of any of Examples 1-3, in which the first shell comprises a rectangular dome.

Example 5 includes the safety container of any of Examples 1-4, in which the first shell comprises an electrically non-conductive material.

Example 6 includes the safety container of any of Examples 1-5, in which the first shell comprises one or more side walls and a top surface, the one or more side walls and the top surface formed from a single piece.

Example 7 includes the safety container of any of Examples 1-6, further comprising: a second shell configured to couple to a support surface, the second shell configured to substantially surround the first shell; and first and second ports in the second shell, the first port of the second shell aligning with the first port of the first shell to allow the fluid into the testing chamber, the second port of the second shell aligning with the second port of the first shell to allow the fluid to exit the testing chamber.

Example 8 includes the safety container of Example 7, further comprising an air gap between the first shell and the second shell.

Example 9 includes the safety container of any of Examples 7-8, in which the second shell comprises one or more side walls and a top surface, the one or more side walls and the top surface of the second shell formed from a single piece.

Example 10 includes the safety container of any of Examples 7-9, in which the second shell comprises a rectangular dome.

Example 11 includes the safety container of any of Examples 7-10, in which a protrusion on either of the first shell or the second shell engages with a receptacle on the other of the first shell or the second shell to align the first shell to the second shell.

Example 12 includes the safety container of any of Examples 7-11, in which at least one of the first port and the second port is configured to accept a camera.

Example 13 includes the safety container of any of Examples 1-12, in which the first shell is configured to couple to a support surface comprising a heating element.

Example 14 includes the safety container of any of Examples 1-13, in which the first shell is configured to couple to a support surface through offset pin holes in the first shell and mating pins on the support surface.

Example 15 includes a method of testing an electronic device-under-test (DUT), the method comprising: positioning the DUT within a testing chamber, the testing chamber being substantially surrounded by a substantially rigid first shell that is sized to accommodate the DUT, the first shell having first and second ports, the first port configured to allow a fluid into the testing chamber, the second port configured to allow the fluid to exit the testing chamber; and applying a high-power electrical signal to test the DUT.

Example 16 includes the method of Example 15, further comprising introducing air into the first port.

Example 17 includes the method of Example 15, further comprising introducing air at a predetermined temperature into the first port.

Example 18 includes the method of any of Examples 15-17, further comprising, before applying the high-power electrical signal to test the DUT: positioning a second shell to substantially surround the first shell; aligning a first port of the second shell with the first port of the first shell; and aligning a second port of the second shell with the second port of the first shell.

Example 19 includes the method of Example 18, in which positioning the second shell to substantially surround the first shell comprises engaging a protrusion on either of the first shell or the second shell with a receptacle on the other of the first shell or the second shell to align the first shell to the second shell.

Example 20 includes the method of any of Examples 15-19, in which positioning the DUT within the testing chamber comprises coupling the first shell to a support surface through offset pin holes in the first shell and mating pins on the support surface.

Aspects may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various configurations. In addition, the functionality may be embodied in whole or in part in firmware or hardware equivalents such as integrated circuits, field programmable gate arrays (FPGA), and the like. Particular data structures may be used to more effectively implement one or more aspects of the disclosed systems and methods, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular example configuration, that feature can also be used, to the extent possible, in the context of other example configurations.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Also, directions such as "vertical," "horizontal," "underneath," "right," and "left" are used for convenience and in reference to the views provided in figures. But the safety container may have a number of orientations in actual use. Thus, a feature that is vertical, horizontal, underneath, to the right, or to the left in the figures may not have that same orientation or direction in actual use.

Although specific example configurations have been described for purposes of illustration, it will be understood that various modifications may be made without departing from the spirit and scope of the disclosure.

We claim:

1. A safety container for high-power, electronic device testing, the safety container comprising:
   a first shell configured to substantially surround a testing chamber sized to accommodate a device-under-test (DUT), the first shell being substantially rigid and configured to couple with a support surface, the safety container further comprising a gasket around a rim of the first shell, the gasket configured to form a seal between the first shell and support surface; and
   first and second ports in the first shell, the first port configured to allow a fluid into the testing chamber, the second port configured to allow the fluid to exit the testing chamber.

2. The safety container of claim 1, in which the fluid is air at a predetermined temperature.

3. The safety container of claim 1, in which the first shell comprises a rectangular dome.

4. The safety container of claim 1, in which the first shell comprises an electrically non-conductive material.

5. The safety container of claim 1, in which the first shell comprises one or more side walls and a top surface, the one or more side walls and the top surface formed from a single piece.

6. The safety container of claim 1, further comprising:
   a second shell configured to couple to a support surface, the second shell configured to substantially surround the first shell; and
   first and second ports in the second shell, the first port of the second shell aligning with the first port of the first shell to allow the fluid into the testing chamber, the second port of the second shell aligning with the second port of the first shell to allow the fluid to exit the testing chamber.

7. The safety container of claim 6, further comprising an air gap between the first shell and the second shell.

8. The safety container of claim 6, in which the second shell comprises one or more side walls and a top surface, the one or more side walls and the top surface of the second shell formed from a single piece.

9. The safety container of claim 6, in which the second shell comprises a rectangular dome.

10. The safety container of claim 6, in which a protrusion on either of the first shell or the second shell engages with a receptacle on the other of the first shell or the second shell to align the first shell to the second shell.

11. The safety container of claim 1, in which the first shell is configured to couple to a support surface comprising a heating element.

12. The safety container of claim 1, in which the first shell is configured to couple to a support surface through offset pin holes in the first shell and mating pins on the support surface.

13. A method of testing an electronic device-under-test (DUT), the method comprising:
   positioning the DUT within a testing chamber, the testing chamber being substantially surrounded by a substantially rigid first shell that is sized to accommodate the DUT and configured to couple with a support surface, the safety container further comprising a gasket around a rim of the first shell, the gasket configured to form a seal between the first shell and support surface, the first shell having first and second ports, the first port configured to allow a fluid into the testing chamber, the second port configured to allow the fluid to exit the testing chamber; and
   applying a high-power electrical signal to test the DUT.

14. The method of claim 13, further comprising introducing air into the first port.

15. The method of claim 13, further comprising introducing air at a predetermined temperature into the first port.

16. The method of claim 13, further comprising, before applying the high-power electrical signal to test the DUT:
   positioning a second shell to substantially surround the first shell;
   aligning a first port of the second shell with the first port of the first shell; and
   aligning a second port of the second shell with the second port of the first shell.

17. The method of claim 16, in which positioning the second shell to substantially surround the first shell comprises engaging a protrusion on either of the first shell or the second shell with a receptacle on the other of the first shell or the second shell to align the first shell to the second shell.

18. The method of claim 13, in which positioning the DUT within the testing chamber comprises coupling the first shell to a support surface through offset pin holes in the first shell and mating pins on the support surface.

* * * * *